(12) United States Patent
Takaki et al.

(10) Patent No.: US 9,985,124 B2
(45) Date of Patent: May 29, 2018

(54) SILICON CARBIDE SEMICONDUCTOR DEVICE

(71) Applicant: Mitsubishi Electric Corporation, Tokyo (JP)

(72) Inventors: Yasushi Takaki, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/307,835

(22) PCT Filed: Jun. 27, 2014

(86) PCT No.: PCT/JP2014/067150
§ 371 (c)(1),
(2) Date: Oct. 31, 2016

(87) PCT Pub. No.: WO2015/198468
PCT Pub. Date: Dec. 30, 2015

(65) Prior Publication Data
US 2017/0054017 A1 Feb. 23, 2017

(51) Int. Cl.
*H01L 29/78* (2006.01)
*H01L 29/16* (2006.01)
(Continued)

(52) U.S. Cl.
CPC .... *H01L 29/7802* (2013.01); *H01L 21/26513* (2013.01); *H01L 29/0696* (2013.01);
(Continued)

(58) Field of Classification Search
None
See application file for complete search history.

(56) References Cited

U.S. PATENT DOCUMENTS

| 5,952,699 A | 9/1999 | Yamazaki et al. |
| 6,703,671 B1 * | 3/2004 | Yamazaki ........... H01L 29/0649 257/339 |

(Continued)

FOREIGN PATENT DOCUMENTS

| JP | 59-149057 A | 8/1984 |
| JP | 09-063983 A | 3/1997 |

(Continued)

OTHER PUBLICATIONS

An Office Action; "Notification of Reason(s) for Refusal" issued by the Japanese Patent Office dated Jan. 10, 2017, which corresponds to Japanese Patent Application No. 2016-528955 and is related to U.S. Appl. No. 15/307,835; with English language partial translation.

(Continued)

*Primary Examiner* — Seahvosh Nikmanesh
*Assistant Examiner* — Xiaoming Liu
(74) *Attorney, Agent, or Firm* — Studebaker & Brackett PC

(57) ABSTRACT

The present invention can reduce an on-resistance while suppressing reduction in a short circuit capacity. The present invention includes a SiC epitaxial layer, a well region, a source region, a channel resistance adjusting region, a gate electrode, an interlayer insulating film, a source electrode, and a drain electrode. The channel resistance adjusting region is sandwiched between the source region and the SiC epitaxial layer in a surface layer of the well region. The channel resistance adjusting region is a region in which a first impurity region is intermittently formed in a direction intersecting a direction in which the source region and the SiC epitaxial layer sandwich the channel resistance adjusting region.

5 Claims, 3 Drawing Sheets

(51) Int. Cl.

| | | |
|---|---|---|
| *H01L 29/739* | (2006.01) | |
| *H01L 29/12* | (2006.01) | |
| *H01L 21/265* | (2006.01) | |
| *H01L 29/06* | (2006.01) | |
| *H01L 29/08* | (2006.01) | |
| *H01L 29/10* | (2006.01) | |
| *H01L 29/167* | (2006.01) | |

(52) U.S. Cl.
CPC ........ *H01L 29/086* (2013.01); *H01L 29/1045* (2013.01); *H01L 29/12* (2013.01); *H01L 29/167* (2013.01); *H01L 29/1608* (2013.01); *H01L 29/739* (2013.01); *H01L 29/78* (2013.01)

(56) References Cited

U.S. PATENT DOCUMENTS

| | | | |
|---|---|---|---|
| 6,956,238 B2 | 10/2005 | Ryu et al. | |
| 8,860,039 B2 | 10/2014 | Miura et al. | |
| 2010/0314629 A1* | 12/2010 | Tarui | H01L 29/0615 257/77 |
| 2014/0353686 A1 | 12/2014 | Miura et al. | |

FOREIGN PATENT DOCUMENTS

| | | |
|---|---|---|
| JP | 09-289314 A | 11/1997 |
| JP | 10-065165 A | 3/1998 |
| WO | 2002/029900 A2 | 4/2002 |
| WO | 2011/135995 A1 | 11/2011 |

OTHER PUBLICATIONS

Notification of Transmittal of Translation of the International Preliminary Report on Patentability and Translation of Written Opinion of the International Searching Authority; PCT/JP2014/067150 dated Jan. 5, 2017.

International Search Report issued in PCT/JP2014/067150; dated Sep. 22, 2014.

An Office Action; "Notification of Reason(s) for Refusal" issued by the Japanese Patent Office dated Jul. 4, 2017, which corresponds to Japanese Patent Application No. 2016-528955 and is related to U.S. Appl. No. 15/307,835; with partial English translation.

An Office Action; "Notification of Reason for Refusal," issued by the Korean Patent Office (KIPO) dated Dec. 10, 2017, which corresponds to Korean Patent Application No. 10-2016-7036267 and is related to U.S. Appl. No. 15/307,835; with English language translation.

* cited by examiner

SILICON CARBIDE SEMICONDUCTOR DEVICE

TECHNICAL FIELD

The present invention relates to a silicon carbide semiconductor device used in an inverter device or the like.

BACKGROUND ART

The conventional n-channel SiC-metal-oxide-semiconductor field-effect transistor (MOSFET) has been designed to reduce a channel resistance (on-resistance) by, such as, shortening a channel length or performing n-type ion injection in the entire channel region (Patent Document 1).

PRIOR ART DOCUMENT

Patent Document

Patent Document 1: Japanese Patent Application Laid-Open No. 59-149057

SUMMARY OF INVENTION

Problem to be Solved by the Invention

However, in the conventional SiC-MOSFET, reducing the channel resistance, in other words, reducing the on-resistance by the above-described means makes saturation current large, so that a short circuit capacity is largely reduced, which has been a problem.

The present invention has been made in order to solve the above problem, and an object thereof is to provide a technology capable of reducing the on-resistance while suppressing reduction in the short circuit capacity.

Means for Solving the Problem

A silicon carbide semiconductor device according to an aspect of the present invention includes an epitaxial layer of a first conductive type formed on an upper surface of a silicon carbide semiconductor substrate, a well region of a second conductive type formed partially in a surface layer of the epitaxial layer, a source region of the first conductive type formed partially in a surface layer of the well region, a channel resistance adjusting region sandwiched between the source region and the epitaxial layer in the surface layer of the well region, a gate electrode formed on an upper surface of the channel resistance adjusting region with a gate insulating film interposed therebetween, an interlayer insulating film formed to cover the gate electrode, a source electrode formed on an upper surface of the interlayer insulating film and an upper surface of the source region, and a drain electrode formed on a lower surface of the silicon carbide semiconductor substrate, in which the channel resistance adjusting region is a region in which a first impurity region of the first conductive type or a second impurity region of the second conductive type is intermittently formed in a direction intersecting a direction in which the source region and the epitaxial layer sandwich the channel resistance adjusting region, an impurity concentration of the first impurity region (6) is higher than an impurity concentration of the epitaxial layer (2) when the channel resistance adjusting region is a region in which the first impurity region (6) is intermittently formed, and an impurity concentration of the second impurity region (6a) is higher than an impurity concentration of the well region (3) when the channel resistance adjusting region is a region in which the second impurity region (6a) is intermittently formed.

Effects of the Invention

According to the above aspect of the present invention, an on-resistance can be reduced while reduction in a short circuit capacity is suppressed. In other words, when a region (channel resistance adjusting region) with a different carrier concentration is formed partially in the surface layer of the well region, current concentrates locally on a region with a low channel resistance. Then, heat generates locally at a part on which current concentrates, and resistance becomes high there, so that the flowing current is suppressed. Accordingly, saturation current is suppressed as compared to that in a semiconductor device having uniform carrier concentration and the same on-resistance in a channel part, so that the short circuit capacity improves.

An object, characteristic, aspect, and advantage of the present invention become clearer through the following detailed description and the accompanying drawings.

DESCRIPTION OF EMBODIMENT

Figure 1:
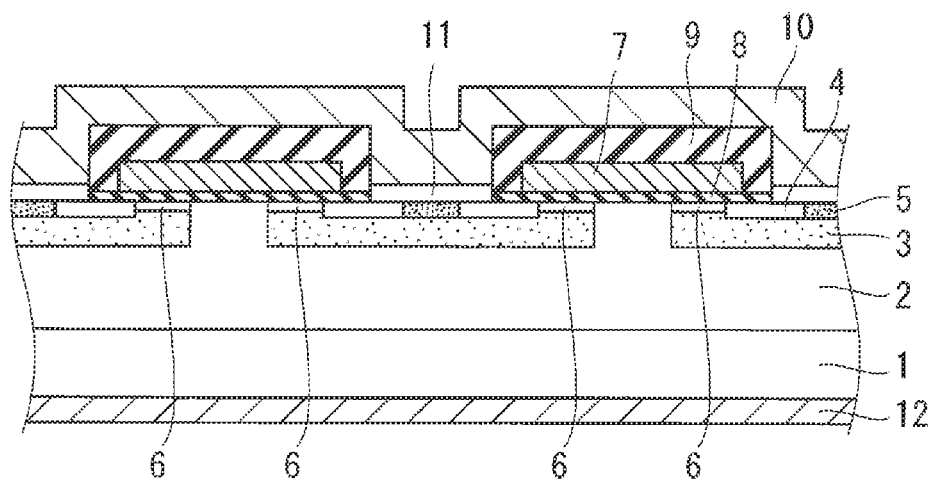
FIG. 1 is a sectional view illustrating the structure of a silicon carbide semiconductor device according to an embodiment.

An embodiment will be described below with reference to the accompanying drawings. Note that the drawings are schematically illustrated, and mutual relations between the sizes and positions of images illustrated in different drawings are not necessarily accurately illustrated, but can be changed as appropriate. In addition, in the following description, the same components are illustrated with the same reference numeral, and their names and functions are the same. Thus, the detailed description thereof may be omitted.

In addition, in the following description, a term that means a particular position or a particular direction, such as "up", "down", "side", "bottom", "front", or "back" is used in some cases, but these terms are used for convenience so as to facilitate understanding of content of the embodiment, and are not related to directions when the invention is actually achieved.

First Embodiment

Configuration

Figure 2:
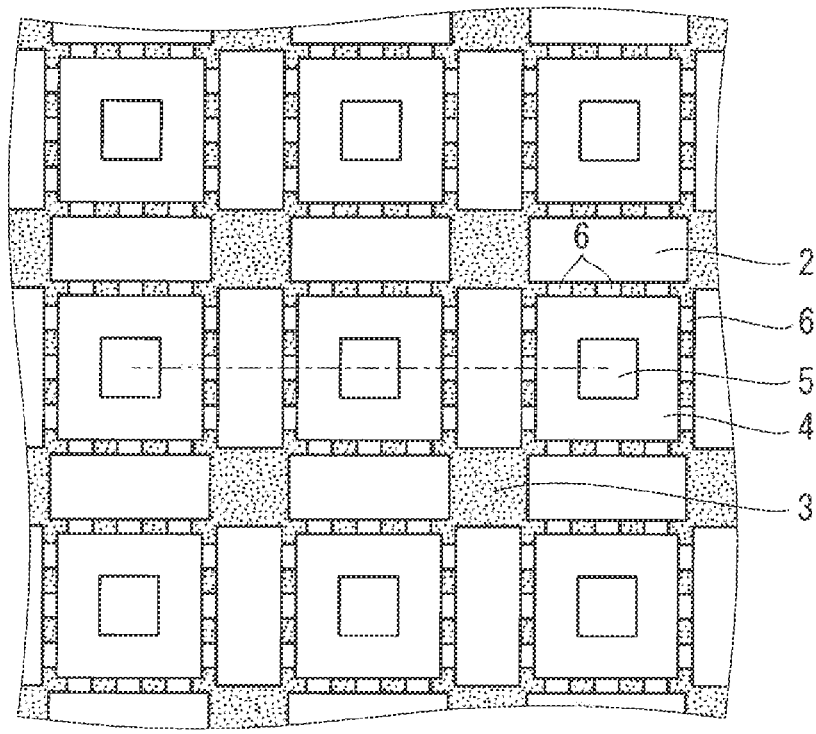
FIG. 2 is a top view illustrating the structure of the silicon carbide semiconductor device according to the embodiment.

FIG. 1 is a sectional view illustrating the structure of a silicon carbide semiconductor device according to the present embodiment. FIG. 1 is a sectional view of a chip of a SiC-MOSFET including a channel resistance adjusting region. FIG. 2 is a top view illustrating the structure of the silicon carbide semiconductor device according to the present embodiment.

A SiC substrate 1 is used as a semiconductor substrate, and an epitaxially grown SiC epitaxial layer 2 of n− type is formed on an upper surface of the SiC substrate 1 of n+ type.

A P-type well region 3 is formed partially (selectively) in a surface layer of the SiC epitaxial layer 2. An N-type source region 4 is formed partially (selectively) in a surface layer of the well region 3. A P-type contact region 5 is formed in a surface layer of the source region 4.

In addition, a channel resistance adjusting region 6 is formed in the surface layer of the well region 3 and sandwiched between the source region 4 and the SiC epitaxial layer 2 in a plan view.

In addition, a gate electrode 7 is formed across part of an upper surface of the source region 4, an upper surface of the channel resistance adjusting region 6, and an upper surface of the SiC epitaxial layer 2. The gate electrode 7 is made of, for example, polysilicon. The gate electrode 7 is formed on the gate insulating film 8. The gate insulating film 8 is made of, for example, silicon dioxide.

In addition, an interlayer insulating film 9 is formed to cover the gate insulating film 8. The interlayer insulating film 9 is made of, for example, Tetraethyl orthosilicate (TEOS). In addition, a source electrode 10 is formed on an upper surface of the interlayer insulating film 9 and the upper surface of the source region 4. The source electrode 10 is formed on a NiSi layer 11 on the contact region 5 and the source region 4.

The drain electrode 12 is formed on a lower surface (back surface) of the SiC substrate 1.

Figure 3:
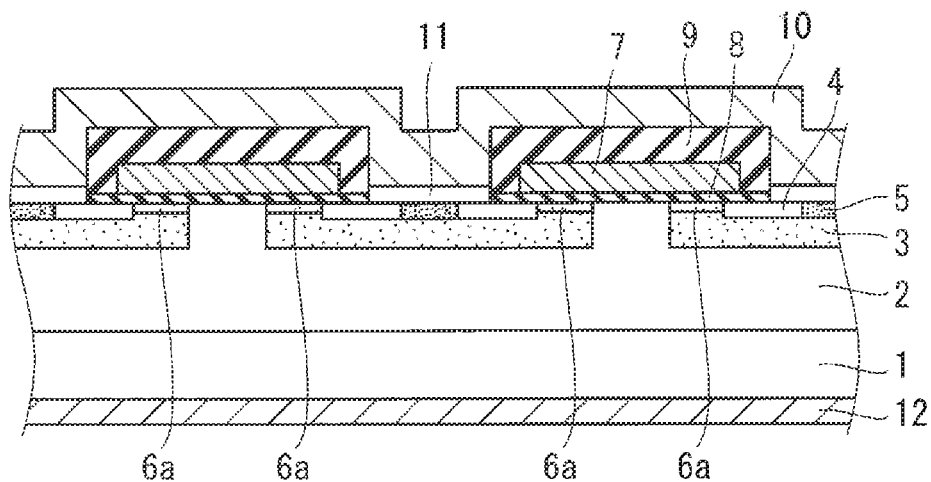
FIG. 3 is a sectional view illustrating another structure of the silicon carbide semiconductor device according to the embodiment.
Figure 4:
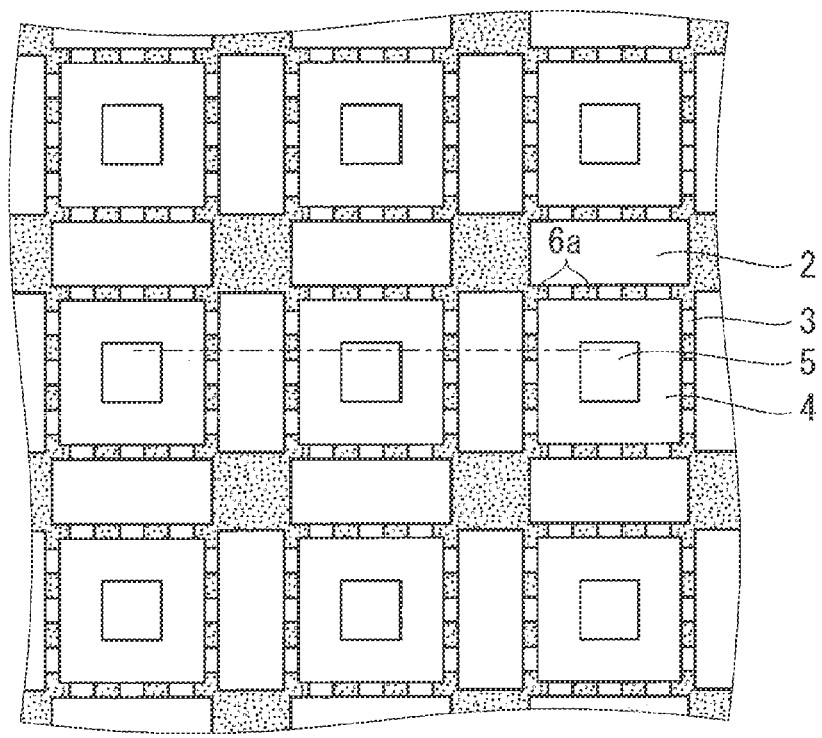
FIG. 4 is a top view illustrating another structure of the silicon carbide semiconductor device according to the embodiment.

Two methods are available for forming the channel resistance adjusting region: one is a method of forming the channel resistance adjusting region as an n-type region as illustrated in FIGS. 1 and 2, and the other is a method of forming the channel resistance adjusting region as a p-type region with a high concentration as illustrated in FIGS. 3 and 4.

When formed as an n-type region, the channel resistance adjusting region 6 is a region in which an impurity region (first impurity region) of a first conductive type (n-type) is intermittently formed in a direction intersecting a direction in which the source region 4 and the SiC epitaxial layer 2 sandwich the channel resistance adjusting region 6.

When formed as a p-type region, the channel resistance adjusting region 6a is a region in which an impurity region (second impurity region) of a second conductive type (p-type) is intermittently formed in a direction intersecting a direction in which the source region 4 and the SiC epitaxial layer 2 sandwich the channel resistance adjusting region 6a.

FIG. 3 is a sectional view illustrating another structure of the silicon carbide semiconductor device according to the present embodiment. FIG. 4 is a top view illustrating the other structure of the silicon carbide semiconductor device according to the present embodiment.

The method of forming the channel resistance adjusting region 6 as an n-type region illustrated in FIGS. 1 and 2 forms a region with a low channel resistance locally in a MOSFET cell. For example, as illustrated in FIG. 2, the channel resistance adjusting region 6 is intermittently formed around the source region 4 in a plan view and on sides surrounding the source region 4.

When the channel resistance adjusting region 6 is formed in this manner, the channel resistance is reduced. In addition, when large current flows at short circuit, the current concentrates on the channel resistance adjusting region 6, heat generates locally at a part on which the current concentrates, and the resistance becomes high there, so that the flowing current is suppressed. Accordingly, saturation current is suppressed as compared to that in a MOSFET having uniform concentration and the same on-resistance in a channel part, and thus a short circuit capacity improves.

In addition, when a region with a different carrier concentration is regularly formed at an equal interval, uniform current flow is achieved as the entire chip, which can prevent damage on the chip due to local current concentration.

Note that, when the channel resistance adjusting region 6 with a low channel resistance is formed at places other than corners of each cell (corners around the source region 4) where a large electric field generates (in other words, the electric field is likely to concentrate), an element is unlikely to be damaged at short circuit.

The structure in which rectangular cells are arranged is exemplarily illustrated in FIGS. 1 and 2, but cells in a stripe structure achieve the same effect.

In addition, FIGS. 1 and 2 illustrate the structure in which regions between rectangular cells are formed in a lattice, and the p-type well region 3 is formed at intersecting places of the lattice, but the well region 3 may not be formed at these intersecting places.

The method of forming the channel resistance adjusting region 6a as a p-type region with a high concentration illustrated in FIGS. 3 and 4 forms a region with a high channel resistance locally in a MOSFET cell. For example, as illustrated in FIG. 4, the channel resistance adjusting region 6a is intermittently formed around the source region 4 in a plan view and on sides surrounding the source region 4.

In the channel resistance adjusting region 6a formed in this manner, when large current flows at short circuit, the current concentrates on places other than the channel resistance adjusting region 6a, heat generates locally at a part on which the current concentrates, and the resistance becomes high there, so that the flowing current is suppressed. Accordingly, the saturation current is suppressed as compared to that in a MOSFET having uniform concentration and the same on-resistance in a channel part, and thus the short circuit capacity improves.

In addition, when a region with a different carrier concentration is regularly formed at an equal interval, uniform current flow is achieved as the entire chip, which can prevent damage on the chip due to local current concentration.

Note that, when the channel resistance adjusting region 6a with a high channel resistance is formed at corners of each cell (corners around the source region 4) where a large electric field generates (in other words, the electric field is likely to concentrate), an element is unlikely to be damaged at short circuit.

The structure in which rectangular cells are arranged is exemplarily illustrated in FIGS. 3 and 4, but cells in a stripe structure achieve the same effect.

In addition, FIGS. 3 and 4 illustrate the structure in which regions between rectangular cells are formed in a lattice, and the p-type well region 3 is formed at intersecting places of the lattice, but the well region 3 may not be formed at these intersecting places.

Material doped in the channel resistance adjusting region is Al or N. A dose amount for Al is equal to or larger than $1 \times 10^{12}$ [N/cm$^2$] approximately, and preferably is equal to or larger than $1 \times 10^{14}$ [N/cm$^2$], which is a concentration higher than the impurity concentration of the well region 3. In addition, a does amount for N is equal to or smaller than $5\times10^{13}$ [N/cm$^2$] approximately, which is a concentration higher than the impurity concentration of the SiC epitaxial layer 2.

In particular, use of Al ion to form the p-type channel resistance adjusting region 6a with a high concentration suppresses thermal diffusion of impurities, so that a p-type region with a high concentration is sharply formed. This is because Al has a small diffusion coefficient as compared to that of B, so that Al is hardly diffused thermally through activation annealing at high temperature after ion injection.

This makes sharp a boundary between a region in which the channel resistance is high and a region in which the channel resistance is low, so that current is likely to locally concentrate.

Thus, when large current flows at short circuit, the current concentrates on a part other than the channel resistance adjusting region, heat generates locally at this part, and the resistance becomes high there, so that the flowing current is suppressed. Accordingly, the saturation current is suppressed as compared to that in MOSFET having uniform concentration and the same on-resistance in a channel part, and thus the short circuit capacity improves.

Note that, although FIGS. 1 to 4 illustrate the examples with a MOSFET, the n+ type substrate may be replaced with a p-type substrate to obtain an insulated gate bipolar transistor (IGBT), with which the same effect of the present invention is obtained.

Figure 5:
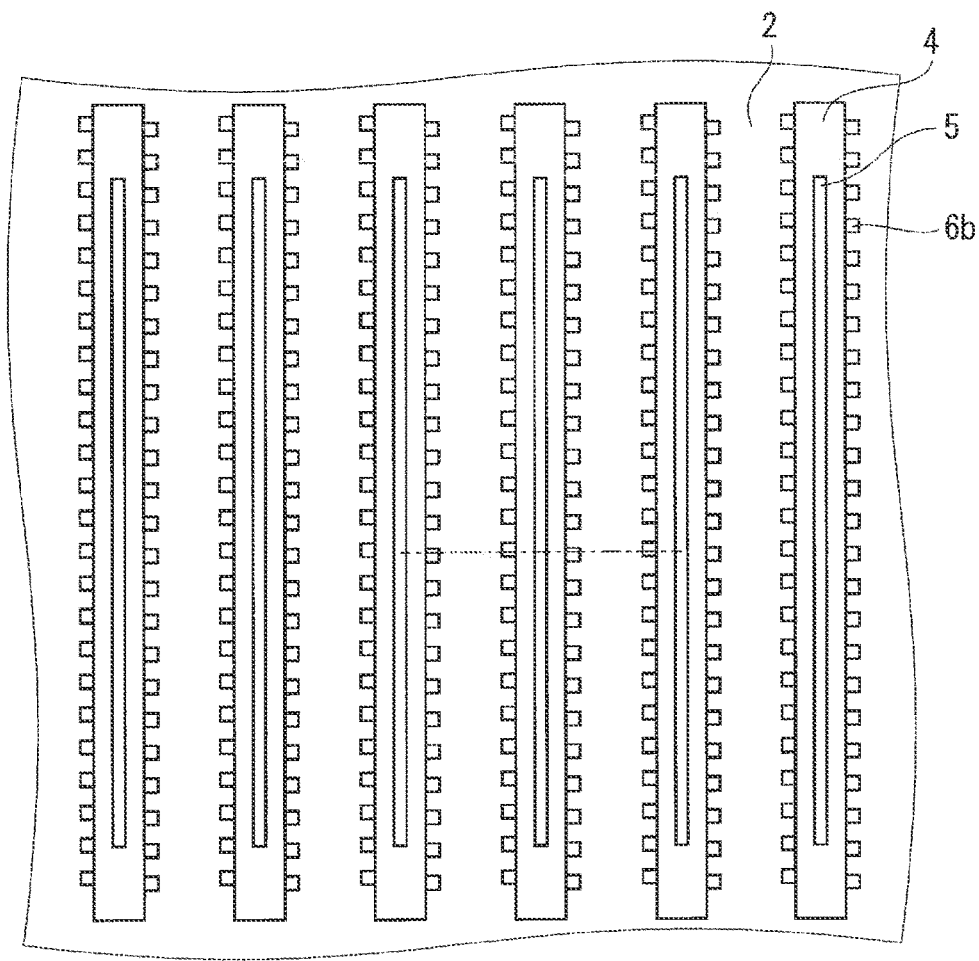
FIG. 5 is a top view illustrating the structure of a modification of the silicon carbide semiconductor device according to the embodiment.
Figure 6:
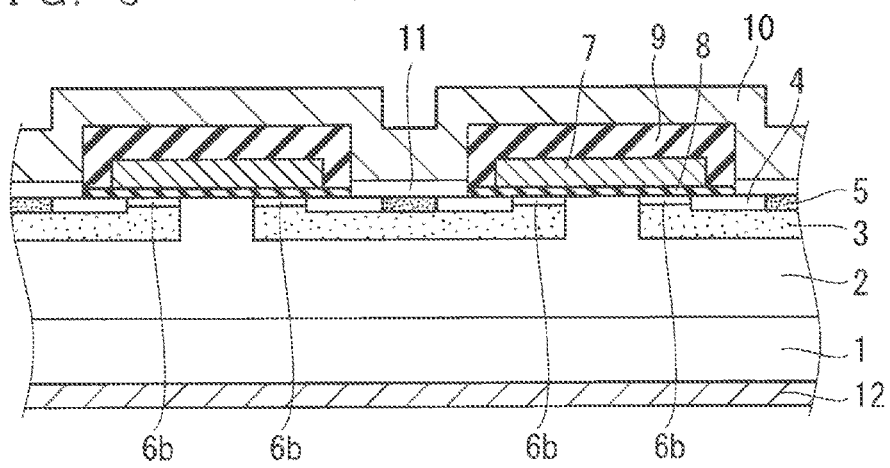
FIG. 6 is a sectional view illustrating the structure of the modification of the silicon carbide semiconductor device according to the embodiment.

FIG. 5 is a top view illustrating the structure of a modification of the silicon carbide semiconductor device according to the present embodiment. FIG. 6 is a sectional view illustrating the structure of the modification of the silicon carbide semiconductor device according to the present embodiment. FIGS. 5 and 6 illustrate a case in which the channel resistance adjusting region 6b is formed as an n-type region in cells in a stripe structure (cells of the well region 3 and the source region 4 in a stripe shape in a plan view).

In the method of forming the channel resistance adjusting region 6b as an n-type region illustrated in FIGS. 5 and 6, a region with a low channel resistance is formed locally in a MOSFET cell. For example, as illustrated in FIG. 5, the channel resistance adjusting region 6b is intermittently formed around the source region 4 in a plan view.

When the channel resistance adjusting region 6b is formed in this manner, the channel resistance is reduced. In addition, when large current flows at short circuit, the current concentrates on the channel resistance adjusting region 6b, heat generates locally at a part on which the current concentrates, and the resistance becomes high there, so that the flowing current is suppressed. Accordingly, the saturation current is suppressed as compared to that in a MOSFET having uniform concentration and the same on-resistance in a channel part, and thus the short circuit capacity improves.

Note that, when the channel resistance adjusting region 6b with a low channel resistance is formed in a region other than corners of each cell where a large electric field generates, an element is unlikely to be damaged at short circuit.

<Effect>

The following exemplarily describes the effect of the present embodiment.

According to the present embodiment, a silicon carbide semiconductor device includes the SiC epitaxial layer 2 of the first conductive type, the well region 3 of the second conductive type, the source region 4 of the first conductive type, the channel resistance adjusting region 6 or the channel resistance adjusting region 6a, the gate electrode 7, the interlayer insulating film 9, the source electrode 10, and the drain electrode 12.

The SiC epitaxial layer 2 is formed on the upper surface of the SiC substrate 1. The well region 3 is formed partially in the surface layer of the SiC epitaxial layer 2. The source region 4 is formed partially in the surface layer of the well region 3. The channel resistance adjusting region 6 and the channel resistance adjusting region 6a are sandwiched between the source region 4 and the SiC epitaxial layer 2 in the surface layer of the well region 3. The gate electrode 7 is formed on the upper surface of the channel resistance adjusting region 6 or the channel resistance adjusting region 6a with the gate insulating film 8 interposed therebetween. The interlayer insulating film 9 is formed to cover the gate electrode 7. The source electrode 10 is formed on the upper surface of the interlayer insulating film 9 and the upper surface of the source region 4. The drain electrode 12 is formed on a lower surface of the SiC substrate 1.

The channel resistance adjusting region 6 is a region in which the first impurity region of the first conductive type is intermittently formed in a direction intersecting a direction in which the source region 4 and the SiC epitaxial layer 2 sandwich the channel resistance adjusting region 6.

The channel resistance adjusting region 6a is a region in which the second impurity region of the second conductive type is intermittently formed in a direction intersecting a direction in which the source region 4 and the SiC epitaxial layer 2 sandwich the channel resistance adjusting region 6a.

Such a configuration can reduce the on-resistance while suppressing reduction in the short circuit capacity. In other words, when a region with a different carrier concentration (the channel resistance adjusting region 6 or the channel resistance adjusting region 6a) is formed partially in the surface layer of the well region 3, current concentrates locally on a region with a low channel resistance. Then, heat generates locally at a part on which the current concentrates, and the resistance becomes high there, so that the flowing current is suppressed. Accordingly, the saturation current is suppressed as compared to that in a semiconductor device having uniform carrier concentration and the same on-resistance in a channel part, and thus the short circuit capacity improves.

In addition, when the impurity concentration of the channel resistance adjusting region 6a is higher than the impurity concentration of the well region 3, electric field concentration at corners of each cell is reduced, and thus reduction in the short circuit capacity can be suppressed.

In addition, when the channel resistance adjusting region 6 is provided at corners of each cell, and an electric field concentrates on the corners of the cell, current concentration occurs, so that there is a possibility that the chip is damaged, and thus the channel resistance adjusting region 6 needs to be provided on sides of the cell.

Note that, although configurations other than these above-described configurations can be omitted as appropriate, the above-described effect can be achieved also when an optional configuration described in the present specification is added as appropriate.

<Modification>

Although the above-described embodiment describes, for example, the material quality, material, dimension, shape, relative arrangement relation, or implementation condition of each component in some cases, these are exemplary in all aspects, and the present invention is not limited to those described. Thus, an indefinite number of modifications not exemplarily illustrated are assumed within the scope of the present invention. Examples of these modifications include a case in which an optional configuration element is deformed or omitted.

REFERENCE SIGNS LIST

1: SiC substrate
2: SiC epitaxial layer
3: well region
4: source region
5: contact region
6, 6a, 6b: channel resistance adjusting region
7: gate electrode
8: gate insulating film
9: interlayer insulating film
10: source electrode
11: NiSi layer
12: drain electrode

The invention claimed is:

1. A silicon carbide semiconductor device, comprising:
an epitaxial layer of a first conductive type formed on an upper surface of a silicon carbide semiconductor substrate;
a well region of a second conductive type formed partially in a surface layer of said epitaxial layer;
a source region of the first conductive type formed partially in a surface layer of said well region;
a channel resistance adjusting region sandwiched between said source region and said epitaxial layer in a direction along an upper surface of said well region in the surface layer of said well region;
a gate electrode formed on an upper surface of said channel resistance adjusting region with a gate insulating film interposed therebetween;
an interlayer insulating film formed to cover said gate electrode;
a source electrode formed on an upper surface of said interlayer insulating film and an upper surface of said source region; and
a drain electrode formed on a lower surface of said silicon carbide semiconductor substrate,
wherein said channel resistance adjusting region is a region in which a first impurity region of the first conductive type is intermittently formed in a direction along said upper surface of said well region intersecting a direction along said upper surface of said well region in which said source region and said epitaxial layer sandwich said channel resistance adjusting region; and
an impurity concentration of said first impurity region is higher than an impurity concentration of said epitaxial layer.

2. The silicon carbide semiconductor device according to claim 1, wherein
said channel resistance adjusting region is formed around said source region in the surface layer of said well region; and
said channel resistance adjusting region on sides around said source region is a region in which said first impurity region is intermittently formed.

3. The silicon carbide semiconductor device according to claim 2, wherein said first impurity region is not formed at corners around said source region.

4. The silicon carbide semiconductor device according to claim 1, wherein said well region and said source region are in a stripe shape in a plan view.

5. The silicon carbide semiconductor device according to claim 1, wherein said channel resistance adjusting region is formed to be entirely sandwiched between said source region and said epitaxial layer, said channel resistance adjusting region being formed in the surface layer of said well region.

* * * * *